United States Patent
Smith

(10) Patent No.: US 7,738,017 B2
(45) Date of Patent: Jun. 15, 2010

(54) METHOD AND APPARATUS FOR AUTOMATIC LINEAR SHIFT PARALLAX CORRECTION FOR MULTI-ARRAY IMAGE SYSTEMS

(75) Inventor: Scott Smith, Los Angeles, CA (US)

(73) Assignee: Aptina Imaging Corporation, Grand Cayman (KY)

( * ) Notice: Subject to any disclaimer, the term of this patent is extended or adjusted under 35 U.S.C. 154(b) by 543 days.

(21) Appl. No.: 11/727,554

(22) Filed: Mar. 27, 2007

(65) Prior Publication Data

US 2008/0239116 A1 Oct. 2, 2008

(51) Int. Cl.
*H04N 5/335* (2006.01)

(52) U.S. Cl. .................... 348/294; 348/335; 348/222.1; 250/208.1

(58) Field of Classification Search ................. 348/250, 348/345, 335, 362, 365, 294, 222.1; 382/278
See application file for complete search history.

(56) References Cited

U.S. PATENT DOCUMENTS

| | | | | |
|---|---|---|---|---|
| 5,041,912 A | * | 8/1991 | Schlig et al. ................. | 382/262 |
| 5,202,670 A | * | 4/1993 | Oha ............................ | 345/671 |
| 6,075,905 A | * | 6/2000 | Herman et al. ............... | 382/284 |
| 2005/0134698 A1 | * | 6/2005 | Schroeder et al. ......... | 348/218.1 |
| 2005/0232459 A1 | * | 10/2005 | Rowe et al. .................. | 382/100 |
| 2006/0078222 A1 | * | 4/2006 | Hwang ........................ | 382/274 |
| 2006/0279632 A1 | * | 12/2006 | Anderson .................... | 348/164 |
| 2007/0034777 A1 | * | 2/2007 | Tuckerman et al. ...... | 250/208.1 |
| 2007/0076481 A1 | * | 4/2007 | Tennant .................. | 365/185.14 |
| 2007/0108978 A1 | * | 5/2007 | MacFarlane et al. ........ | 324/318 |

OTHER PUBLICATIONS

U.S. Appl. No. 11/367,580.
U.S. Appl. No. 11/540,673.
U.S. Appl. No. 11/642,867.

* cited by examiner

*Primary Examiner*—Tuan Ho
(74) *Attorney, Agent, or Firm*—Dickstein Shapiro LLP

(57) ABSTRACT

A method and apparatus for correcting linear shift parallax error in multi-array image systems. Average pixel cell signal values for pixel cells within a summing window of each column or row of at least two sub-arrays are computed during read-out. The images of the sub-arrays are correlated based on the averages, then shifted based on a result of the correlation function to correct the exhibited parallax error. The summation, correlation, and shifting can be performed by a pixel pipeline processing circuit.

40 Claims, 9 Drawing Sheets

METHOD AND APPARATUS FOR AUTOMATIC LINEAR SHIFT PARALLAX CORRECTION FOR MULTI-ARRAY IMAGE SYSTEMS

FIELD OF THE INVENTION

Embodiments of the invention relate generally to imagers and, more specifically, to methods and apparatuses for correcting linear shift parallax in multi-array imager systems.

BACKGROUND

Imagers typically consist of a single array of pixel cells containing photosensors, where each pixel cell produces a signal corresponding to the intensity of light impinging on its photosensor when an image is focused on the array by one or more lenses. These signals may then be stored, for example, to display a corresponding image on a monitor or otherwise used to provide information about the optical image. The magnitude of the signal produced by each pixel is substantially proportional to the amount of light impinging on the photosensor.

To allow the imager to capture a color image, the pixel cells must be able to separately detect red (R) light, green (G) light, and blue (B) light. A color filter array is typically placed in front of the array of pixel cells so that each pixel cell measures only light of the color of its associated filter.

Alternatively, an imager may comprise a plurality of pixel cell arrays. Each array is often referred to as a "sub-array" and the imager is itself often referred to as a "multi-array" imager. Each sub-array is typically sensitive to only one color of light. The images from each of the sub-arrays are combined to form a full-color image. Such imagers are disclosed in U.S. patent application Ser. No. 11/367,580, Ser. No. 11/540,673, and Ser. No. 11/642,867, all assigned to Micron Technology, Inc. and incorporated herein by reference in their entirety.

Multi-array imagers offer numerous advantages over conventional single-array imagers. For example, because each sub-array is typically sensitive to only a single color, crosstalk caused by adjacent Bayer patterned different colored pixels is reduced, thereby improving overall color performance and removing color shading artifacts. Moreover, the design of the lens used to focus light on each sub-array may be simplified because each lens is only required to operate over the relatively narrow portion of the spectrum detectable by its respective sub-array.

While they offer numerous advantages, multi-array imagers suffer from parallax error due to the side-by-side arrangement of the sub-arrays. In particular, imagers comprising a plurality of sub-arrays arranged in a linear configuration suffer from linear shift parallax error, where imaged objects appear at different locations along an axis of each sub-array. FIG. 1 illustrates linear shift parallax error. Light from an object 1 to be imaged passes through lenses 2, 3, and 4 associated with sub-arrays 5, 6, and 7, respectively. Light from the object 1 and thus an image of the object 1 registers in a different position along the x-axis of each sub-array. Sub-array 6 registers the image of object 1 at position $X_0$. Sub-array 7 registers the image of object 1 at a different position $X_-$ shifted in one direction from position $X_0$. Sub-array 5 registers the image of object 1 at yet another position $X_+$ shifted in the opposite direction from position $X_0$.

FIG. 2 shows the images formed from each sub-array. Images 8, 9, and 10 are the images formed from sub-arrays 7, 6, and 5, respectively. Combining the images without correcting the linear shift parallax error yields an undesirable image in which the object 1 appears simultaneously in several, typically overlapping positions, as shown in image 19 of FIG. 7.

Thus, an efficient method for correcting linear shift parallax error in multi-array imagers is desirable.

DETAILED DESCRIPTION OF THE PREFERRED EMBODIMENTS

In the following detailed description, reference is made to the accompanying drawings, which form a part hereof and show by way of illustration specific embodiments in which the invention may be practiced. These embodiments are described in sufficient detail to enable those skilled in the art to practice them, and it is to be understood that other embodiments may be utilized. The progression of processing steps described is exemplary of embodiments of the invention. However, the sequence of steps is not limited to that set forth herein and may be changed as is known in the art, with the exception of steps necessarily occurring in a certain order.

Figure 1:
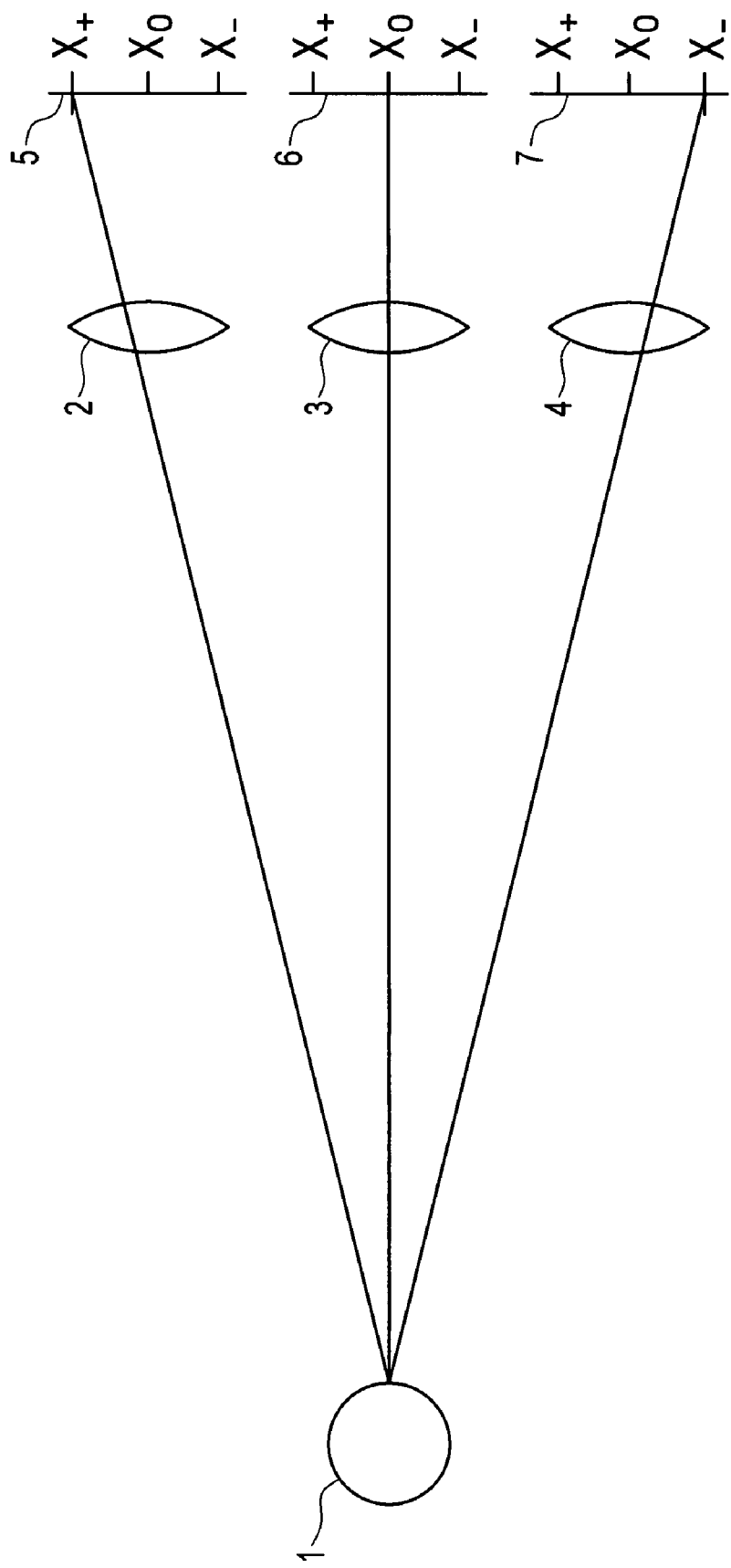
FIG. 1 is a plan view of an object to be imaged and a multi-array imager exhibiting linear shift parallax error.
Figure 2:
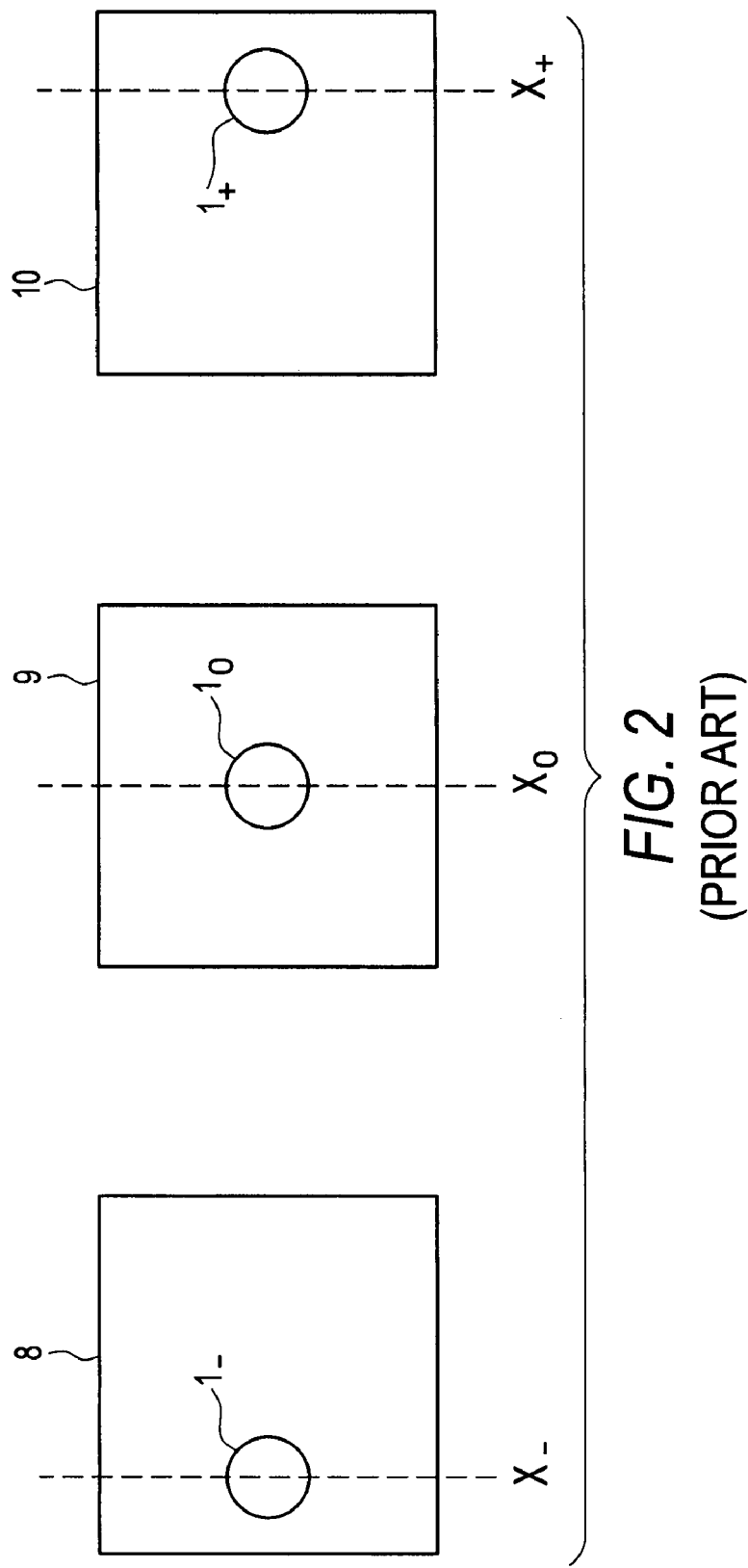
FIG. 2 depicts the images formed from each sub-array of the imager shown in FIG. 1.
Figure 3:
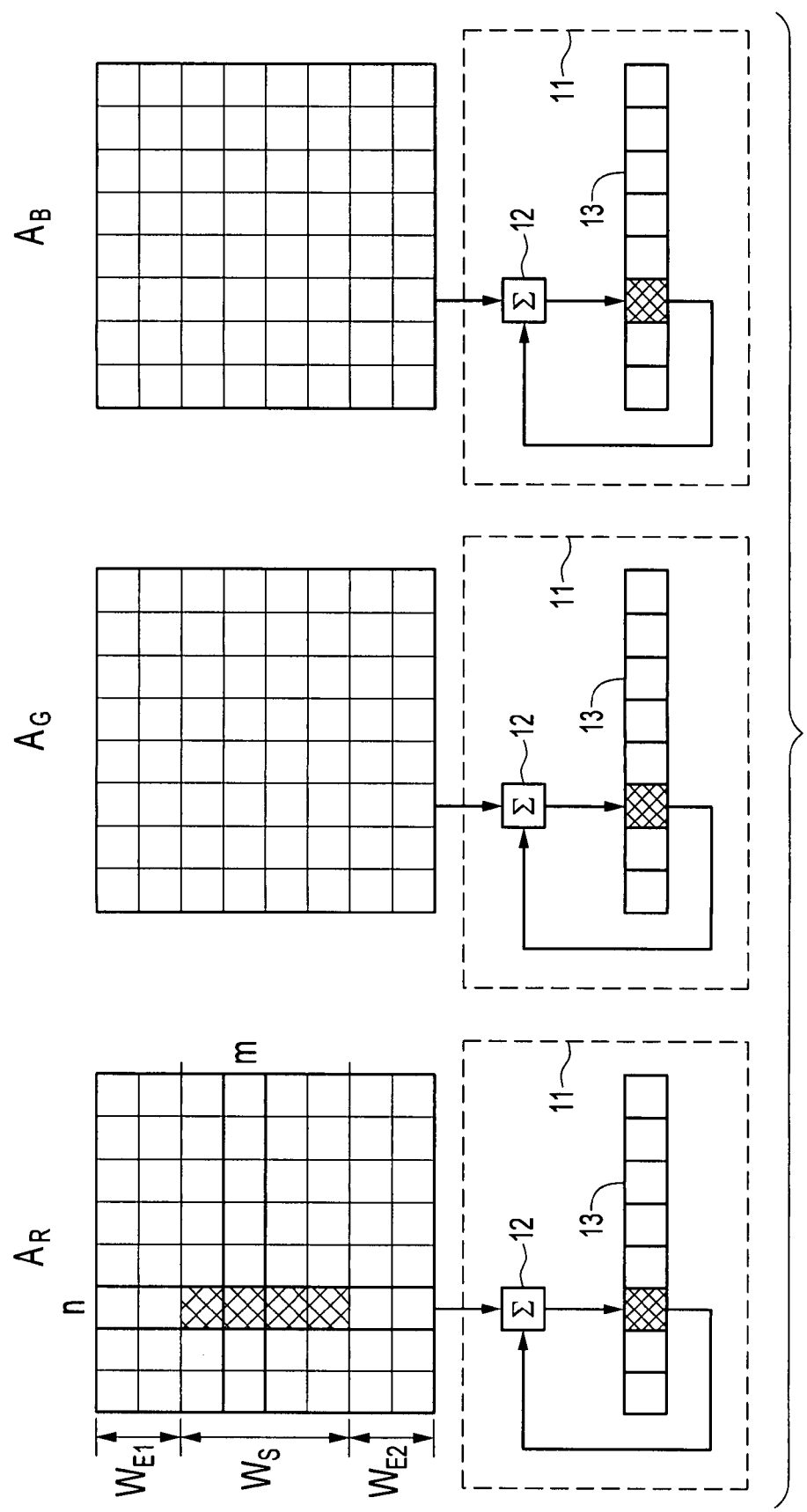
FIG. 3 depicts a linear sensor array in accordance with an embodiment described herein.

FIG. 3 depicts a portion of a multi-array imager comprising a linear sensor array in accordance with an embodiment described herein. Three sub-arrays $A_R$ (red), $A_G$ (green), and $A_B$ (blue) collectively referred to as sub-arrays A, are shown, however any number N of sub-arrays may be present. The sub-arrays are arranged in a 1×N grid, thus forming a linear sensor array. Each of the sub-arrays A comprises an array of pixel cells organized as a plurality of rows and columns. Although eight rows and eight columns are shown, other arrangements are possible and typical pixel cell arrays may comprise thousands or millions of pixel cells arranged in a square or rectangular configuration.

The pixel cells within each column are divided into at least one exclusion window $W_E$ and at least one column summing window $W_S$. In the embodiment depicted in FIG. 3, each column n is divided into two exclusion windows $W_{E1}$ and $W_{E2}$ each comprising $C_E/2$ pixel cells and one summing window $W_S$ comprising $C_S$ pixel cells, as further defined below. The two exclusion windows preferably comprise the first and last rows in a column while the summing window preferably comprises the rows in-between. For example, the pixel cells within the summing window $W_S$ of a column n are depicted as shaded in FIG. 3.

The number of pixel cells in the summing window $W_S$ is preferably selected such that $C_S + C_E$ equals the total number of pixel cells in a column and $C_S = 2^k$ where k is an integer. In other words, the number of pixel cells in the summing window $W_S$ is preferably a power of 2, e.g. 2, 4, 8, . . . 256, 512, etc. As described in detail below, this selection permits efficient averaging of pixel cell values within the summing window.

After an acquisition period in which charge builds in each pixel cell in proportion to the amount of incident light, pixel cell values are read-out in accordance with practices well known in the art. In addition and according to an embodiment of the invention, pixel cell values corresponding to pixel cells within the summing window $W_S$ are summed by summing and storage circuit 11 as each pixel cell value is read-out. The operation and structure of summing and storage circuit 11 is shown in greater detail in FIG. 4.

Figure 4:
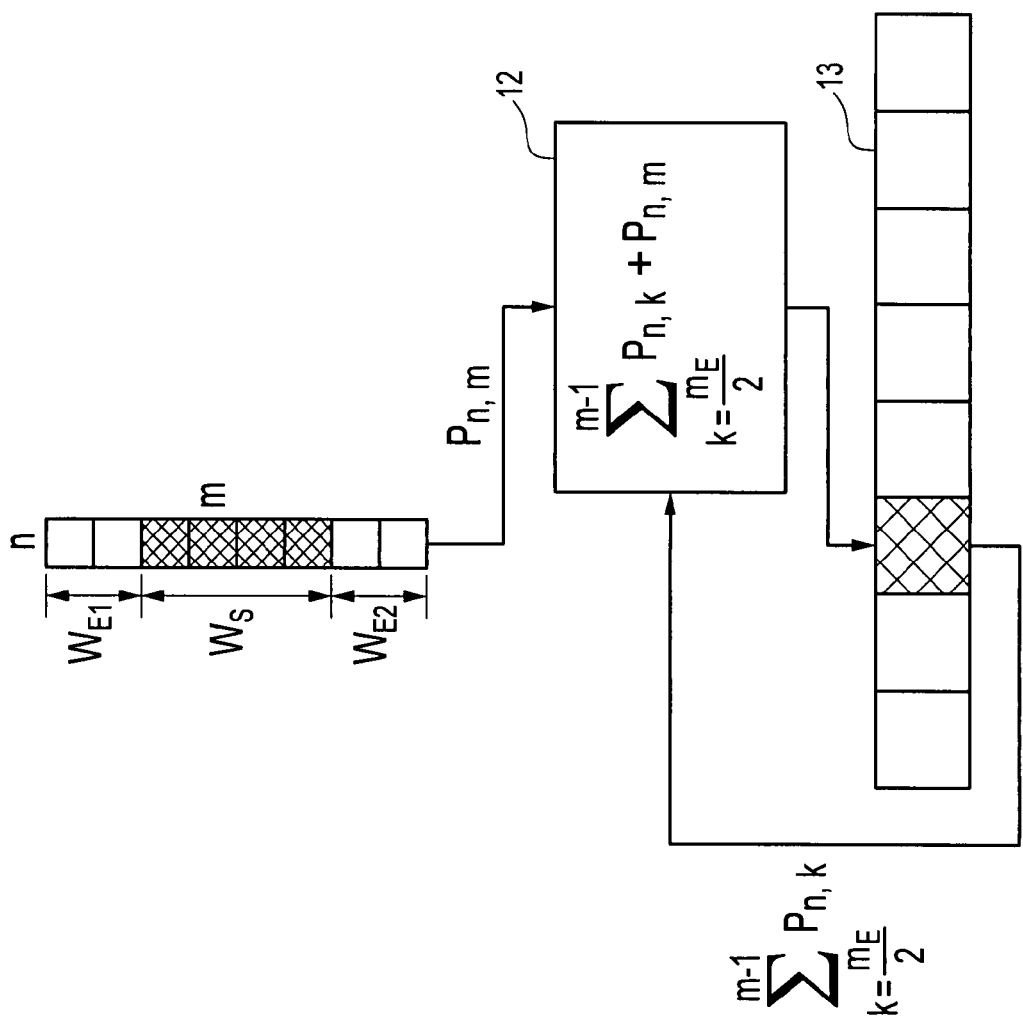
FIG. 4 depicts the summing and storage circuit 11 of FIG. 3 in greater detail.

As shown in FIG. 4, the summing and storage circuit 11 comprises a summing circuit 12 and a memory 13. The memory 13 comprises one memory location corresponding to each column of its respective pixel cell array. When the pixel cell signal read-out begins, the value of each memory location 13 is initialized to 0. As each pixel cell signal value $P_{n,m}$, corresponding to the signal value of the pixel cell at column n and row m, within the summing window $W_S$ is read-out, the summing circuit 12 adds the value $P_{n,m}$ to the value in the memory location corresponding to column n. Thus, once the signals of all of the pixel cells within the summing window $W_S$ of a column have been read-out, the memory location corresponding to the column holds a value equal to the sum of the values of the pixel cells within the summing window of the column.

Still referring to FIG. 4, the operation of the summing and storage circuit 11 during read-out of a column n is now described by specific example. At the start of the read-out process, the value of each memory location in memory 13 is initialized to 0. The pixel cell values corresponding to pixel cells within the first exclusion window $W_{E1}$ are read-out in accordance with practices well known in the art. These values are not included in the column sum computed by the summing circuit 12 and stored in memory 13 because the pixel cells are outside the summing window $W_S$. When the first pixel in the summing window $W_S$ is read-out, the summing circuit 12 adds the value of the pixel to the value stored in the memory location of memory 13 corresponding to the column n. Since this is the first pixel in the summing window $W_S$ and the memory location corresponding to column n held a value 0 at the start of the read-out operation, the sum computed by summing circuit 12 is equal to the value of this first pixel in the summing window $W_S$.

As each successive pixel cell in the summing window $W_S$ is read-out, the summing circuit 12 adds the corresponding pixel cell value $P_{n,m}$ to the sum stored in the memory location of memory 13 corresponding to the column n. Thus, once the last pixel cell in the summing window $W_S$ has been read-out and processed by the summing circuit 12, the memory location of memory 13 corresponding to column n holds a value equal to the sum of the values of all of the pixel cells in the summing window $W_S$ of column n.

Sums for other columns in the pixel cell array are computed similarly as each column is read-out. Summing and storage circuits 11 associated with each other sub-array comprising the linear sensor array likewise compute column sums for their respective sub-arrays, as depicted in FIG. 3. In a desired embodiment, the summing circuit 12 operates at the pixel read-out rate and the pixel cell values of each sub-array are read-out and summed in parallel. Thus, column sums for all columns in all sub-arrays are stored in each sub-array's respective memory 13 after all of the pixel cells in the summing window $W_S$ of each sub-array have been read-out.

Figure 5:
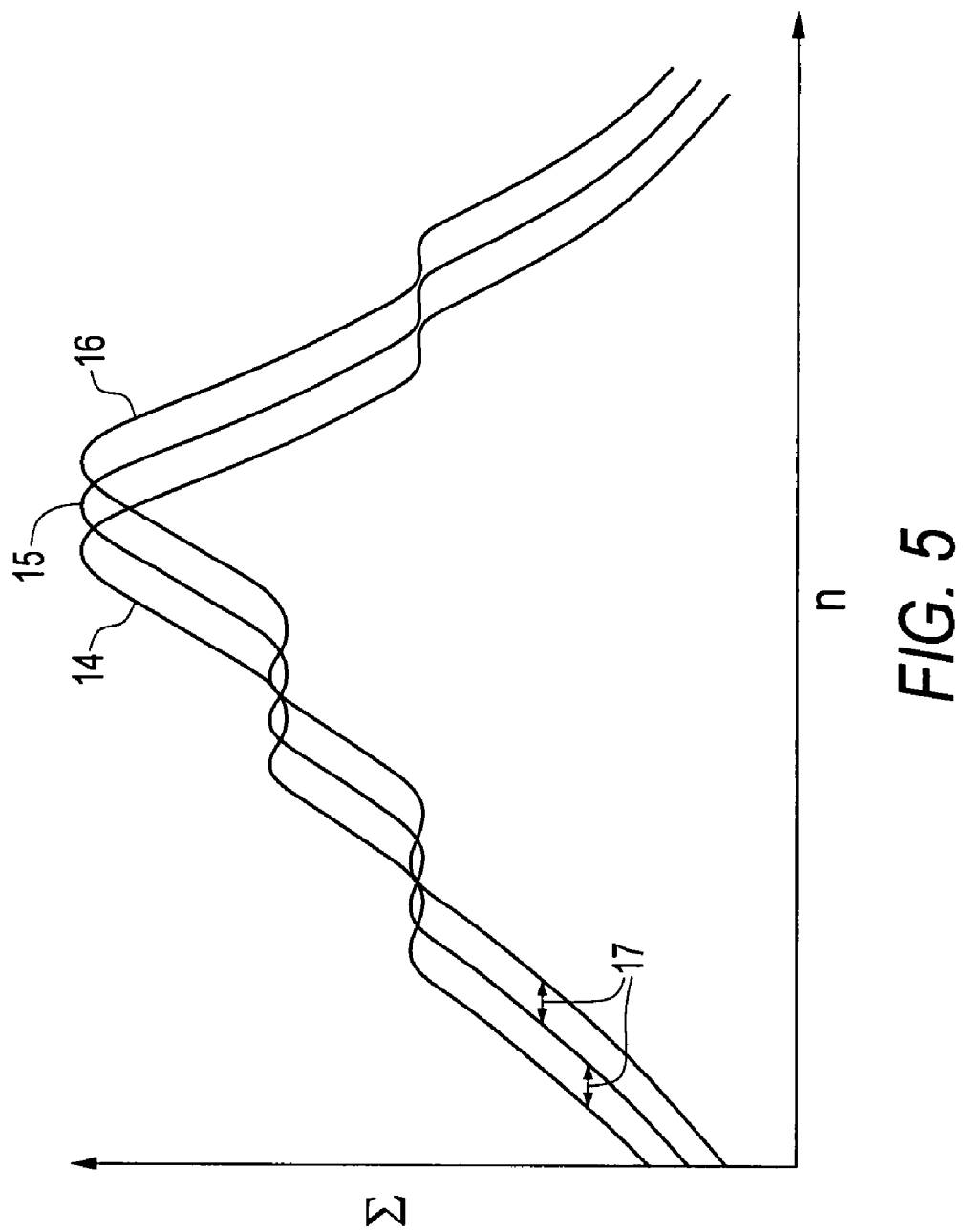
FIG. 5 is a graph of the column sums computed for each sub-array in accordance with an embodiment described herein.

FIG. 5 is a graph of a column sum corresponding to each column n of sub-arrays $A_R$, $A_G$, and $A_B$, in accordance with an exemplary embodiment. Three plots labeled 14, 15, and 16 are shown, corresponding to the three sub-arrays $A_R$, $A_G$, and $A_B$, respectively. However, the embodiments described are not so limited and may include only two sub-arrays or an arbitrary number of sub-arrays. The distance 17 between the plots 14, 15, and 16 corresponds to the linear parallax error between the sub-arrays. The extent of the distance 17 is determined by correlating the respective images of the sub-arrays $A_R$, $A_G$, and $A_B$, as described below.

An average of the pixel values in the summing window $W_S$ of each column of each sub-array must be computed before their respective images can be correlated. If the summing window $W_S$ is chosen, as described above, such that there are $2^k$ pixel cells within the summing window $W_S$ where k is an integer, then the average can be efficiently computed by shifting the each column sum by k bits. For example, suppose a column contains 1,024 pixel cells, of which 512 are in the summing window $W_S$. Further suppose the sum of the pixel cell signal values of the 512 pixel cells in the summing window $W_S$ is 60,104, expressed in binary notation as 1110 1010 1100 1000. Because the summing window $W_S$ contains 512 pixels and $2^9 = 512$ (i.e., k=9), the average can be efficiently computed by shifting the sum by 9 bits, yielding 0111 0101 in binary notation or 117 in decimal notation.

Once column sums for the columns of at least two sub-arrays have been computed, the images of the respective sub-arrays can be correlated. In one embodiment, images from two sub-arrays F and G (not shown) are correlated with the following correlation function:

$$corr(j) = \sum_{i=j+1}^{N} (f_i - \bar{f})(g_{i-j} - \bar{g})$$

where f and g are the average pixel cell values in each column i of sub-arrays F and G, respectively, which are computed as described above. N is the number of columns in each of the sub-arrays F and G to be correlated, and $\bar{f}$ and $\bar{g}$ are the averages of the average pixel cell values $f_i$ and $g_i$ in all columns i of sub-arrays F and G, respectively.

Conventionally, the correlation function is computed for each value j from 1 to N, where j represents the extent of the shift, expressed in pixels, required to correct the exhibited parallax error. Computing the correlation function corr(j) for each value j from 1 to N requires $N^2$ operations, which is prohibitive for real-time sensor read-out. However, if the correlation is constrained such that the function corr(j) is computed only for each value j from 1 to $T_{max}$, then the number of operations is reduced to $N \cdot T_{max}$. For typical linear sensor array configurations in which sensors are positioned close together, a sufficiently small $T_{max}$ can be chosen to permit correlation within one frame read-out time. For example, if sensors are located 2 to 3 millimeters apart, a $T_{max}$ value of approximately 20 would be sufficient to correct parallax error in typical macro imaging of flat surfaces and requires only N·20 operations.

If the correlation calculation is performed at the pixel clock rate, then computing the correlation function corr(j) for each value j takes approximately one row read-out time of an imager sub-array. $C_E$ row read-out times are available per frame since the column summing window $W_S$ comprises only $C_S$ rows, as detailed above. Therefore, if $T_{max} < C_E$, the correlation can be completed within a single frame read-out time. This allows each new image to be corrected for linear shift parallax with only a single frame delay, which is particularly important for imagers configured to output a video signal.

Figure 6:
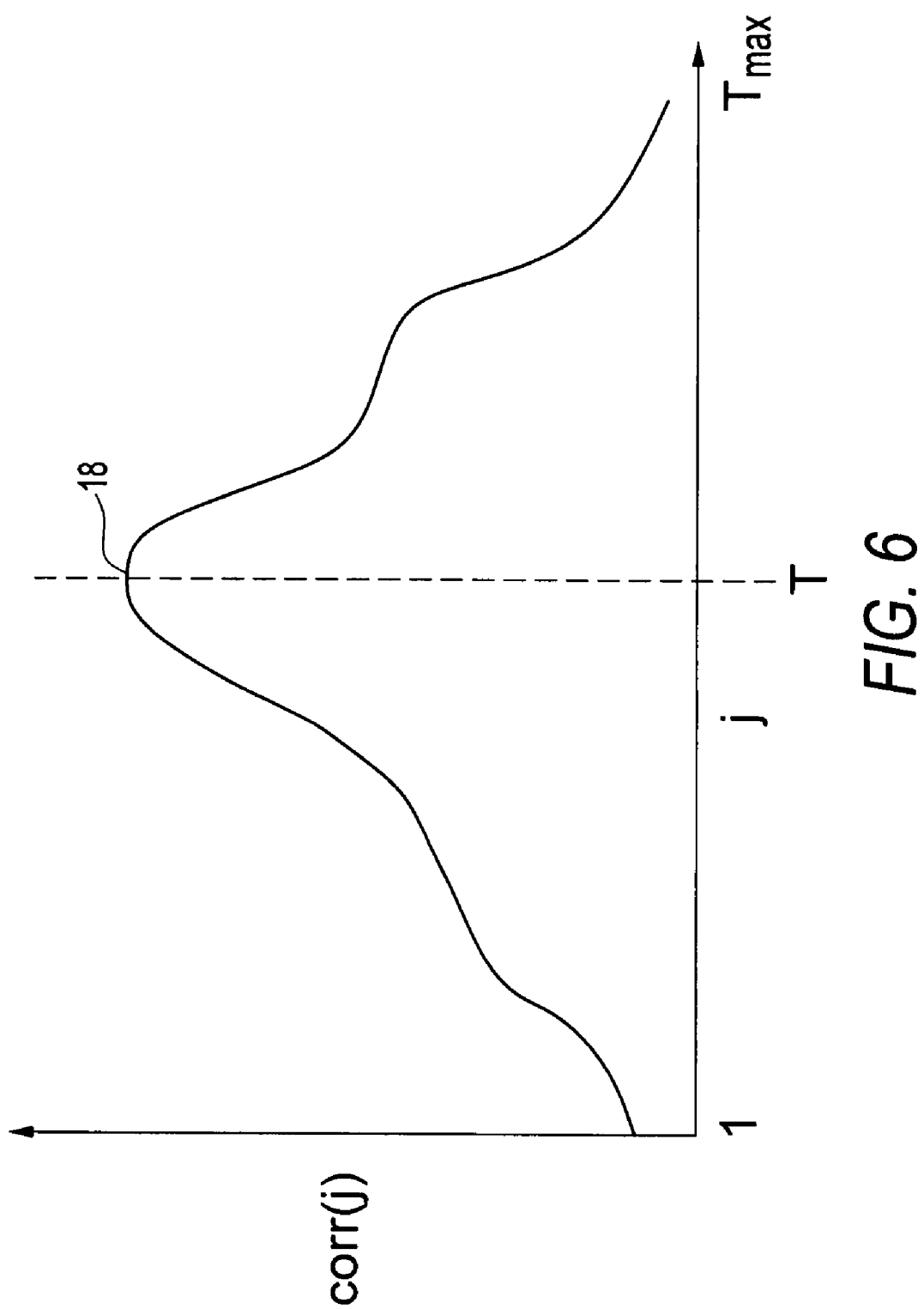
FIG. 6 is a graph of the correlation function output in accordance with an embodiment described herein.

FIG. 6 is a graph of correlation function corr(j) outputs for a range of input values j from 1 to $T_{max}$. The parallax shift point T is determined by identifying the value j at which the correlation function corr(j) is maximized, illustrated by point 18 on the graph. Once the linear parallax shift point T is determined, the images from sub-arrays F and G must be shifted T pixels with respect to each either. Typically, the image of sub-array F is shifted T pixels, though other shifting schemes are possible. For example, the images from both sub-arrays F and G could be shifted in opposite directions along the same axis by T/2 pixels. The correlation and shifting steps are repeated for each successive sub-array in the linear sensor array. Thus, the correlation and shifting steps are performed a total of Z−1 times, where Z represents the number of sub-arrays in the linear sensor array.

Figure 7:
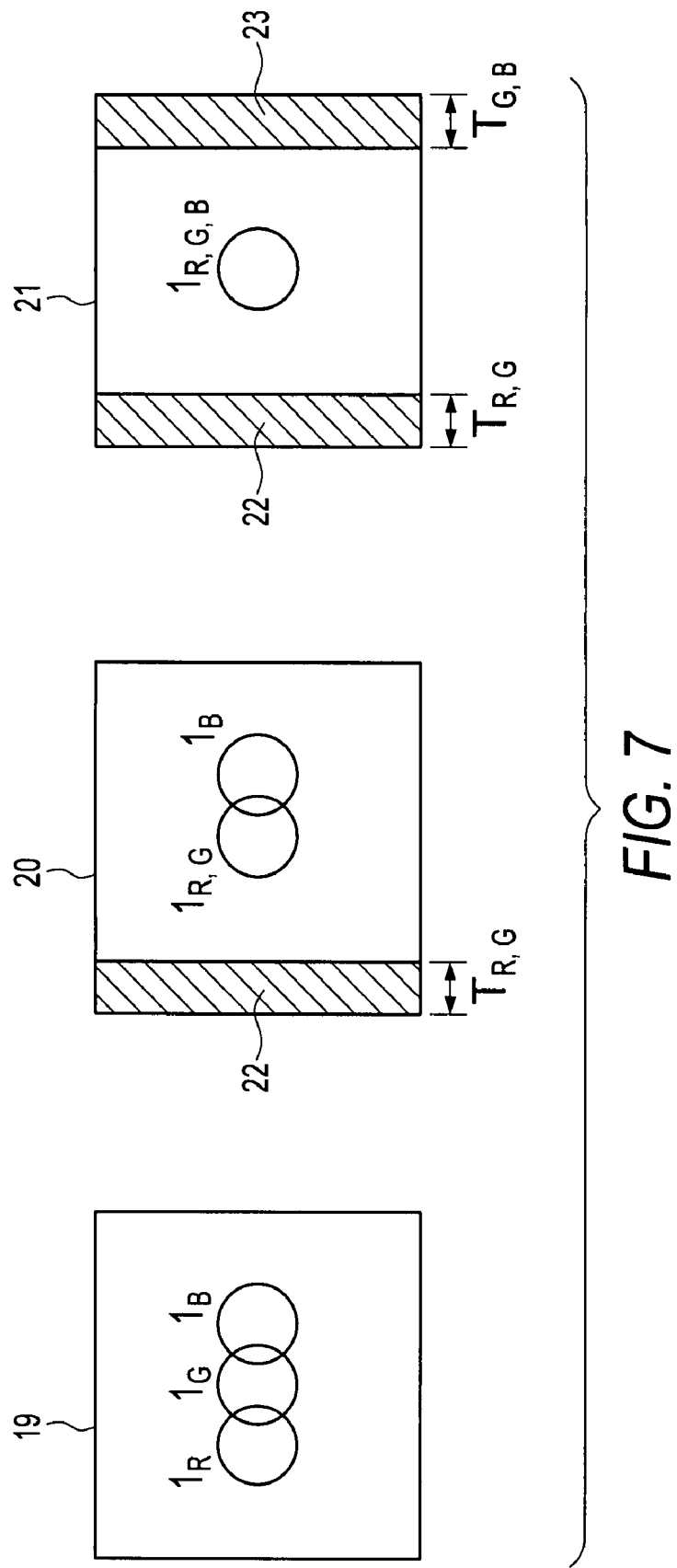
FIG. 7 depicts combined images before shifting, after shifting the image from one sub-array, and after shifting the images from two sub-arrays in accordance with an embodiment described herein.

FIG. 7 illustrates the images from three sub-arrays at progressive stages of the shifting process. Image 19 depicts the registered position of the object 1 imaged by a sub-array sensitive to red light ($1_R$), a sub-array sensitive to green light ($1_G$), and a sub-array sensitive to blue light ($1_B$) before linear parallax error is corrected by shifting. Linear shift parallax error is evidenced by a shift of the object 1 image along the x-axis of the images formed by the sub-arrays. The red and green images are correlated, as described above, to determine a parallax shift point value $T_{R,G}$. The red channel image is then shifted $T_{R,G}$ pixels to the right, causing the object images $1_R$ and $1_G$ to substantially coincide, as illustrated in image 20. Shifting the image of the red sub-array to the right by $T_{R,G}$ pixels leaves a region 22 $T_{R,G}$ pixels wide at the left side of the image 20 lacking red channel pixel values.

The correlation and shifting process is repeated using the green and blue channel images as input, yielding another parallax shift value $T_{G,B}$. The blue channel image is then shifted $T_{G,B}$ pixels to the left, causing object image $1_B$ to substantially coincide with the object image $1_{R,G}$ of the previously-correlated red and green channel image, as shown in image 21. Shifting the image of the blue sub-array to the left by $T_{G,B}$ pixels leaves a region 23 $T_{G,B}$ pixels wide at the right side of the image 21 lacking blue channel pixel values.

In one embodiment, the combined image 21 is cropped to eliminate the columns in regions 22 and 23 that lack a pixel value for at least one channel. In an alternative embodiment, the missing pixel values are replaced with values interpolated from other pixel values in those regions or elsewhere in the image.

Although the foregoing description refers to summing pixel signal values for each column, summing by rows is also possible and, depending on the configuration of the linear sensor array, may be desirable. For example, when the sub-arrays are arranged horizontally, i.e. the rows of each sub-array are aligned as shown in FIG. 3, column summing, as described above, is preferred. However, if the sub-arrays are arranged vertically, i.e. the columns of each sub-array are aligned, row summing is preferred. In one embodiment, row sums are computed by an image processor during read-out similarly to the column summing described above.

In yet another embodiment, sums and averages are computed for fewer than all of the columns (or rows in the alternative embodiment just described). For example, sums and averages might be computed for only every other column, thereby reducing the number of summing and averaging operations by fifty percent. However, considering fewer than all of the columns may reduce the accuracy of the correlation function and, therefore, reduce the extent to which parallax error is corrected in the resulting image. Nevertheless, this embodiment may be preferred when real-time video output of corrected images is desired and cannot otherwise be achieved due to, for example, insufficient processor time.

Figure 8:
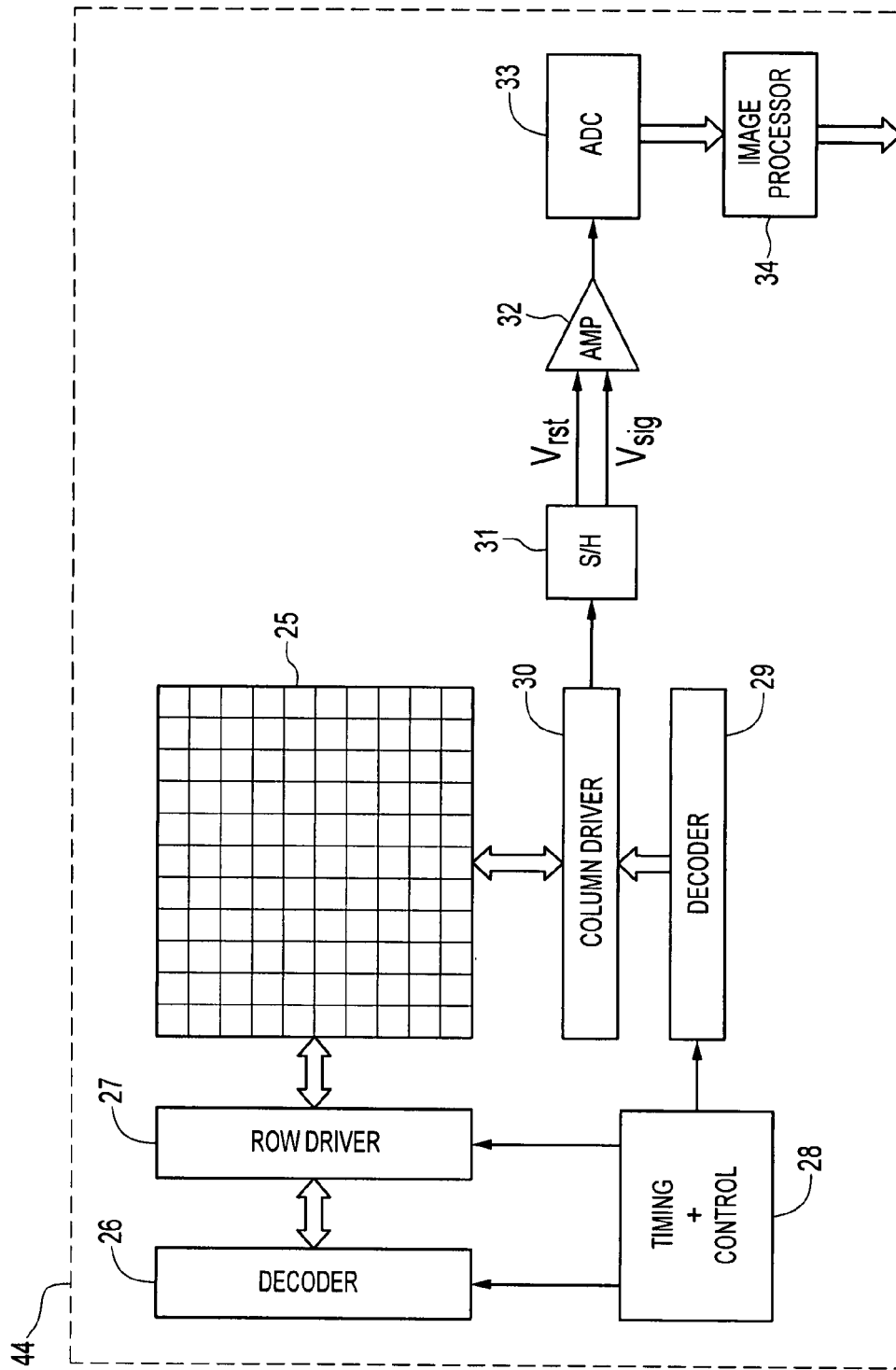
FIG. 8 is a partial top-down block diagram view an imager constructed in accordance with an embodiment described herein.

FIG. 8 illustrates a partial top-down block diagram view an imager 44 constructed in accordance with an embodiment disclosed herein. Although only one sub-array 25 is shown to simplify illustration, the imager 44 contains a plurality of sub-arrays arranged in a linear configuration, as described herein. The plurality of sub-arrays may be formed on a single chip or on a plurality of chips connected via a bus. FIG. 13 illustrates a CMOS imager and associated read-out circuitry, but other embodiments may employ other types of imagers, e.g. a CCD imager.

When the imager 44 is operated to capture light, the pixel cells in each row of sub-array 25 are all turned on at the same time by a row select line, and the signals of the pixel cells of each column are selectively output onto output lines by respective column select lines. A plurality of row and column select lines are provided for the sub-array. The row lines are selectively activated in sequence by the row driver 27 in response to row address decoder 26 and the column select lines are selectively activated in sequence for each row activation by the column driver 30 in response to column address decoder 29. Thus, row and column addresses are provided for each pixel cell comprising the sub-array 25. The imager 44 is operated by the timing and control circuit 28, which controls address decoders 26 and 29 for selecting the appropriate row and column select lines for pixel cell read-out, and row and column driver circuitry 27 and 30, which apply driving voltage to the drive transistors of the selected row and column lines.

In a CMOS imager, the pixel output signals typically include a pixel reset signal $V_{rst}$ taken off of the floating diffusion region (via a source follower transistor) when it is reset and a pixel image signal $V_{sig}$, which is taken off the floating diffusion region (via a source follower transistor) after charges generated by an image are transferred to it. The $V_{rst}$ and $V_{sig}$ signals are read by a sample and hold circuit 31 and are subtracted by a differential amplifier 32 that produces a difference signal ($V_{rst}-V_{sig}$) for each pixel cell of sub-array 25, which represents the amount of light impinging on the pixel cell. This signal difference is digitized by an analog-to-digital converter (ADC) 33. The digitized pixel signals are then fed to an image processor 34 which processes the pixel signals and forms a digital image output. It is also possible to have separate driver and read-out circuits for each sub-array with the pixel output from the ADC 33 of each sub-array feeding into a common image processor circuit 34. As depicted in FIG. 8, the imager 44 is formed on a single semiconductor chip, although other configurations are possible, as known in the art.

Image processor circuit 34 may be constructed as a hardware circuit with associated memory, or as a programmed processor with associated memory, or as a combination of a hardware circuit and a programmed processor with associated memory. In one embodiment, the image processor circuit 34 is a pixel signal pipeline processing circuit which performs various operations on image pixel values received from one or more pixel arrays. In this embodiment, the summing circuit 12 is a circuit within the pixel pipeline processor and the memory 13 is a line buffer memory associated with the pixel pipeline processor. The correlating and shifting steps described above may also be implemented in circuits within the pixel pipeline processor. Alternatively, the correlating and shifting steps may be performed by a central processing unit (CPU) coupled to the image processor circuit 34.

While FIG. 8 depicts one such-array 25, since each sub-array in the embodiments described herein is arranged in a linear direction, the read-out circuitry for operating sub-array 25 can be shared for the other sub-arrays by having all rows of all sub-arrays linearly aligned and sharing common row driver circuits and with each sub-array having respective column drivers for the column addresses of the sub-arrays which feed pixel values into the circuits 31-34.

In one embodiment, the column summing, averaging, correlation, and shifting steps are performed by the image processor circuit 34, which is typically located on the same chip as the sub-array 25 and associated elements 26-33. Indeed, summing within the image processor circuit 34 is advantageous because the sum can be computed iteratively, according to the method described above, as each pixel cell value is output from the ADC 33 and received by the image processor circuit 34. Of course, other configurations are possible. For example, the correlation and shifting steps might be performed by a central processing unit (CPU) connected to the imager 44 by a bus 46, as shown in FIG. 9.

Figure 9:
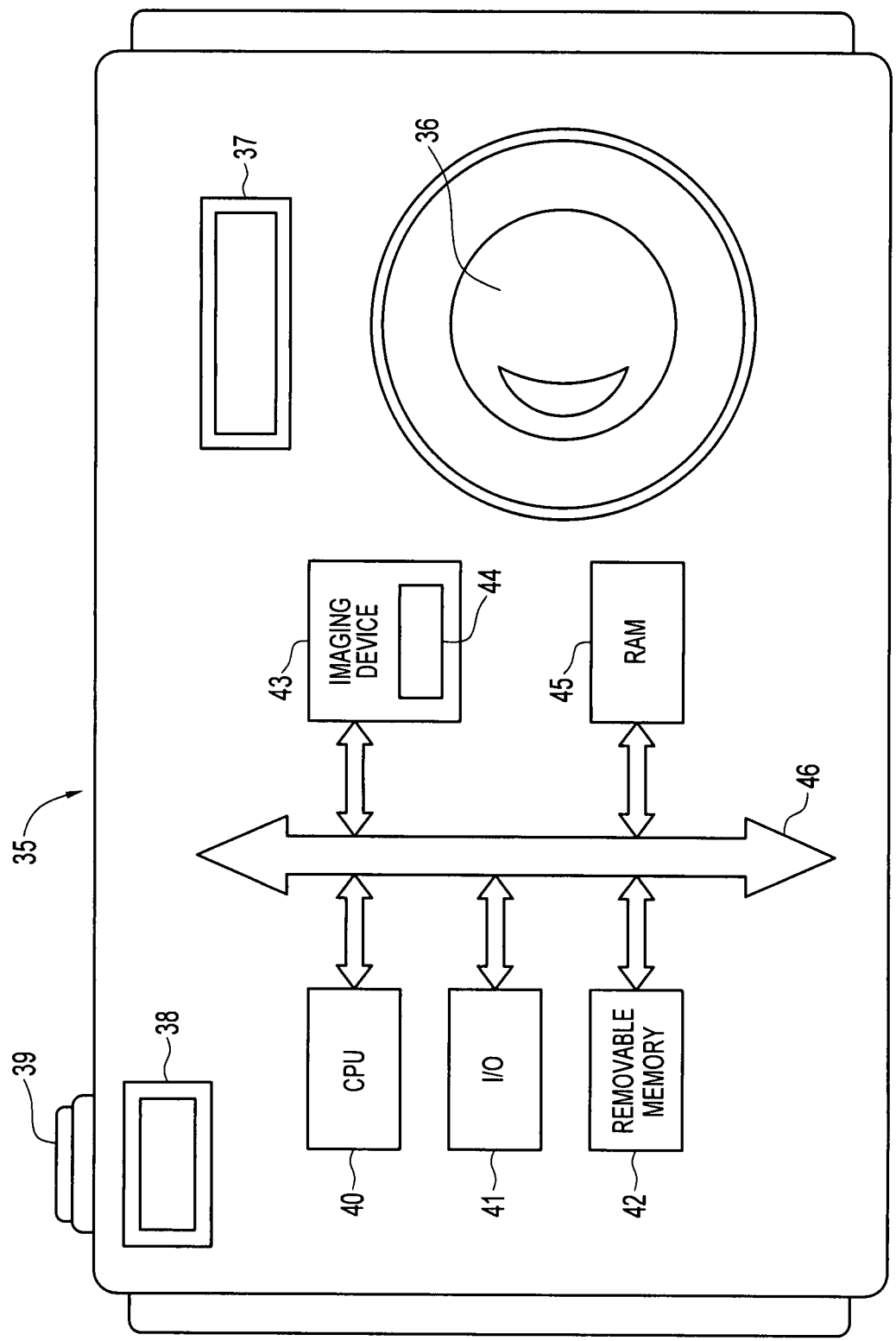
FIG. 9 depicts a camera system comprising the imager of FIG. 8 and constructed in accordance with an embodiment described herein.

FIG. 9 shows a typical system 35, such as, for example, a camera. The system 35 includes an imaging device 43 having an imager 44 comprising a linear sensor array constructed in accordance with an embodiment described herein. The system 35 is an example of a system having digital circuits that could include image sensor devices. Without being limiting, such a system could include a computer system, camera system, scanner, machine vision, vehicle navigation system, video phone, surveillance system, auto focus system, star tracker system, motion detection system, image stabilization system, and other systems employing an imager.

System 35, for example, a camera system, includes a lens 36 for focusing an image on the imager 44 when a shutter release button 39 is pressed. System 35 generally comprises a central processing unit (CPU) 40, such as a microprocessor that controls camera functions and image flow, and communicates with an input/output (I/O) device 41 over a bus 46. The imager of device 35 also communicates with the CPU 40 over the bus 46. The processor-based system 35 also includes random access memory (RAM) 45, and can include removable memory 42, such as flash memory, which also communicates with the CPU 40 over the bus 46. The imaging device 43 may be combined with the CPU 40, with or without memory storage on a single integrated circuit or on a different chip than the CPU.

While embodiments of the invention have been described in detail in connection with the examples known at the time, it should be readily understood that they are not limited to such disclosed embodiments. Rather, they can be modified to incorporate any number of variations, alterations, substitutions, or equivalent arrangements not heretofore described. Accordingly, the invention is not to be seen as limited by the foregoing description, but is only limited by the scope of the claims.

What is claimed as new and desired to be protected by Letters Patent of the United States is:

1. A method of correcting parallax error in images acquired from a plurality of pixel cell arrays, said method comprising:

computing a plurality of either column sums or row sums of pixel signal values from each of the plurality of pixel cell arrays;

computing an average pixel signal value corresponding to each of said plurality of sums;

correlating the average pixel signal values of the plurality of pixel cell arrays; and shifting an image formed from at least one of the plurality of pixel cell arrays based on a result of the correlation.

2. The method of claim 1, wherein the plurality of pixel cell arrays comprise three pixel cell arrays.

3. The method of claim 2, wherein a first pixel cell array is sensitive to red light, a second pixel cell array is sensitive to green light, a third pixel cell array is sensitive to blue light.

4. The method of claim 2, wherein average pixel signal values from a first pixel cell array and a second pixel cell array are correlated, average pixel signal values from the second pixel cell array and a third pixel cell array are correlated, and at least two images formed from the plurality of pixel cell arrays are shifted based on a result of the correlations.

5. The method of claim 1, wherein the plurality of sums is computed in conjunction with a pixel signal read-out operation of the pixel cell arrays.

6. The method of claim 1, wherein each of said plurality of sums is a column sum.

7. The method of claim 1, wherein each of said plurality of sums is a row sum.

8. The method of claim 6, wherein fewer than all of the pixel signal values in a column are included in each column sum.

9. The method of claim 8, wherein a first and last group of pixel signal values in each column are excluded from the respective column sum and a middle group of pixel signal values are included in the respective column sum.

10. The method of claim 9, wherein the middle group of pixel signal values comprises $2^k$ pixel signal values where k is an integer.

11. The method of claim 10, wherein each average pixel signal value is computed by shifting the corresponding column sum by k bits.

12. The method of claim 1, wherein the correlating step comprises determining a maximum of a correlation function.

13. The method of claim 12, wherein the correlation function is:

$$corr(j) = \sum_{i=j+1}^{N} (f_i - \bar{f})(g_{i-j} - \bar{g})$$

where f and g are average pixel cell values of each column i of pixel cell arrays F and G, respectively, N is a number of columns in each pixel cell array F and G, and $\bar{f}$ and $\bar{g}$ are averages of average pixel cell values $f_i$ and $g_i$ for all columns i of pixel cell arrays F and G, respectively.

14. The method of claim 1, wherein the shifting step comprises shifting an image along a single axis.

15. A method of correcting linear shift parallax error in an imager having a plurality of linearly-arranged sub-arrays, said method comprising:

reading pixel cell values from a plurality of sub-arrays;

computing sums of pixel values for columns of pixels as said pixel cell values are read-out;

computing average pixel cell values for each of the columns;

correlating images formed from the plurality of sub-arrays based on the average pixel cell values; and shifting an image formed from at least one of the plurality of sub-arrays based on a result of the correlation.

16. The method of claim 15, further comprising combining the images formed from the plurality of sub-arrays after at least one of the images has been shifted.

17. The method of claim 15, wherein the sums and the average pixel cell values are computed by an image processing circuit.

18. The method of claim 17, wherein the image processing circuit is on the same chip as the plurality of sub-arrays.

19. The method of claim 15, wherein the correlating and shifting steps are performed by an image processing circuit.

20. The method of claim 17, wherein the correlating and shifting steps are performed by a central processing unit coupled to the image processing circuit.

21. An imager, comprising:
a plurality of sub-arrays arranged in a linear configuration, each sub-array comprising pixel cells organized in rows and columns;
a read-out circuit for reading out pixel cell values from said plurality of sub-arrays; and
a pixel signal processing circuit configured to compute a sum of the pixel cell values for either columns or rows in each of said plurality of sub-arrays, to compute an average associated with each sum, to correlate images formed from the plurality of sub-arrays based on the averages, and to shift an image formed from at least one of the plurality of sub-arrays in accordance with a result of the correlation.

22. The imager of claim 21, wherein the pixel signal processing circuit is configured to compute a sum comprising only values of pixel cells within a summing window, wherein the summing window comprises fewer than all of the pixel cells within each column or row.

23. The imager of claim 21, wherein the pixel signal processing circuit is configured to compute a sum by adding a pixel cell value from the read-out circuit to a partial sum stored in a memory and write the result back to the memory.

24. The imager of claim 21, wherein the memory is a line buffer memory.

25. The imager of claim 21, wherein the pixel signal processing circuit is a pixel pipeline processor.

26. The imager of claim 21, wherein the pixel signal processing circuit is configured to operate at no less than the pixel read-out clock rate.

27. The imager of claim 21, wherein the result of the correlation is a maximum of a correlation function.

28. The method of claim 27, wherein the correlation function is:

$$corr(j) = \sum_{i=j+1}^{N} (f_i - \overline{f})(g_{i-j} - \overline{g})$$

where f and g are average pixel cell values of each column i of sub-arrays F and G, respectively, N is a number of columns in each sub-array F and G, and $\overline{f}$ and $\overline{g}$ are averages of average pixel cell values $f_i$ and $g_i$ for all columns i of sub-arrays F and G, respectively.

29. The imager of claim 21, wherein the plurality of sub-arrays comprises:

a sub-array configured to detect red light;
a sub-array configured to detect green light; and
a sub-array configured to detect blue light.

30. The imager of claim 21, wherein each of the plurality of sub-arrays is spaced between approximately 2 millimeters and approximately 3 millimeters from an adjacent sub-array.

31. The imager of claim 21, further comprising an output port configured to output correlated images to a video device.

32. An imager, comprising:
a red sub-array, a green sub-array, and a blue sub-array arranged in a linear configuration, wherein one of the sub-arrays is a center sub-array;
a read-out circuit for reading out pixel cell values from the sub-arrays; and
a pixel processing circuit, comprising:
a summing circuit configured to compute a sum of the pixel cell values for columns in each of the sub-arrays; and
a buffer memory associated with the summing circuit for storing sum values,
wherein the pixel processing circuit is configured to correlate images from a first sub-array and the center sub-array using said sum values in a first correlation, shift an image formed from the first sub-array based on a result of the first correlation, correlate images formed from a second sub-array and the center sub-array using said sum values in a second correlation, shift the image formed from the second sub-array based on a result of the second correlation, and combine the shifted images from said first and second sub-arrays with the image from the center sub-array.

33. The imager of claim 32, wherein the green sub-array is the center sub-array.

34. The imager of claim 32, further comprising a lens for focusing an image on said sub-arrays.

35. The imager of claim 34, further comprising a color filter respectively associated with each sub-array such that each sub-array detects respective wavelengths of light.

36. The imager of claim 32, wherein the pixel processing circuit is a pixel pipeline processor.

37. A camera system, comprising:
an imager, comprising:
a plurality of sub-arrays arranged in a linear configuration, each sub-array comprising pixel cells organized into rows and columns and each sub-array responsive to a respective band of wavelengths of light;
a read-out circuit for reading out pixel cell values from said plurality of sub-arrays;
a lens for focusing an image on said sub-arrays; and
a pixel signal processing circuit configured to compute a sum of the pixel cell values for each column in each of said sub-arrays, to average the sums of the pixel cell values, to correlate images formed from the plurality of sub-arrays using said averages, to shift an image from at least one of the plurality of sub-arrays based on a result of the correlation, and to combine shifted and unshifted images corresponding to said plurality of sub-arrays.

38. The imager of claim 37, further comprising an output port configured to output combined images.

39. A method of correcting parallax error in images acquired from a plurality of pixel cell arrays, said method comprising:
computing a plurality of either column sums or row sums of pixel signal values from each of the plurality of pixel cell arrays;
computing an average pixel signal value corresponding to each of said plurality of sums;

correlating the average pixel signal values of the plurality of pixel cell arrays by determining a maximum of a correlation function; and shifting an image formed from at least one of the plurality of pixel cell arrays based on a result of the correlation, wherein the correlation function is:

$$corr(j) = \sum_{i=j+1}^{N} (f_i - \bar{f})(g_{i-j} - \bar{g})$$

where f and g are average pixel cell values of each column i of pixel cell arrays F and G, respectively, N is a number of columns in each pixel cell array F and G, and $\bar{f}$ and $\bar{g}$ are averages of average pixel cell values $f_i$ and $g_i$ for all columns i of pixel cell arrays F and G, respectively.

40. An imager, comprising:

a plurality of sub-arrays arranged in a linear configuration, each sub-array comprising pixel cells organized in rows and columns;

a read-out circuit for reading out pixel cell values from said plurality of sub-arrays; and a pixel signal processing circuit configured to compute a sum of the pixel cell values for either columns or rows in each of said plurality of sub-arrays, to compute an average associated with each sum, to correlate images formed from the plurality of sub-arrays based on the averages, and to shift an image formed from at least one of the plurality of sub-arrays in accordance with a result of the correlation, wherein the result of the correlation is a maximum of a correlation function, and wherein the correlation function is:

$$corr(j) = \sum_{i=j+1}^{N} (f_i - \bar{f})(g_{i-j} - \bar{g})$$

where f and g are average pixel cell values of each column i of sub-arrays F and G, respectively, N is a number of columns in each sub-array F and G, and $\bar{f}$ and $\bar{g}$ are averages of average pixel cell values $f_i$ and $g_i$ for all columns i of sub-arrays F and G, respectively.

* * * * *